United States Patent [19]

Kandybowski

[11] Patent Number: 4,647,124
[45] Date of Patent: Mar. 3, 1987

[54] ELECTRICAL CONNECTOR FOR INTERCONNECTING ARRAYS OF CONDUCTIVE AREAS

[75] Inventor: Steven J. Kandybowski, Tower City, Pa.

[73] Assignee: AMP Incorporated, Harrisburg, Pa.

[21] Appl. No.: 787,837

[22] Filed: Oct. 16, 1985

[51] Int. Cl.⁴ .............................................. H01R 9/09
[52] U.S. Cl. ................................ 339/17 CF; 339/222
[58] Field of Search .......... 339/17 CF, 17 M, 17 LM, 339/222, 258 R, 176 M, 176 MP

[56] References Cited

U.S. PATENT DOCUMENTS

| 4,199,209 | 4/1980 | Cherian et al. | 339/17 M |
| 4,354,729 | 10/1982 | Grabbe et al. | 339/17 CF |
| 4,502,747 | 3/1985 | Bright et al. | 339/17 CF |
| 4,504,887 | 3/1985 | Bakermans et al. | 339/17 CF |

FOREIGN PATENT DOCUMENTS 1187074  9/1959  France ............................ 339/258 P

*Primary Examiner*—Neil Abrams
*Attorney, Agent, or Firm*—Allan B. Osborne

[57] ABSTRACT

An electrical connector for positioning between and electrically interconnecting electrical components. The electrical connector includes a dielectric housing having compartments and contact elements freely disposed in the compartments and having cantilever spring arms having conductive contact areas at the free ends thereof for electrical engagement with conductive pads or the like on the electrical components and further having shorting fingers attached to and extending from the spring arms for electrical engagement with each other.

4 Claims, 7 Drawing Figures

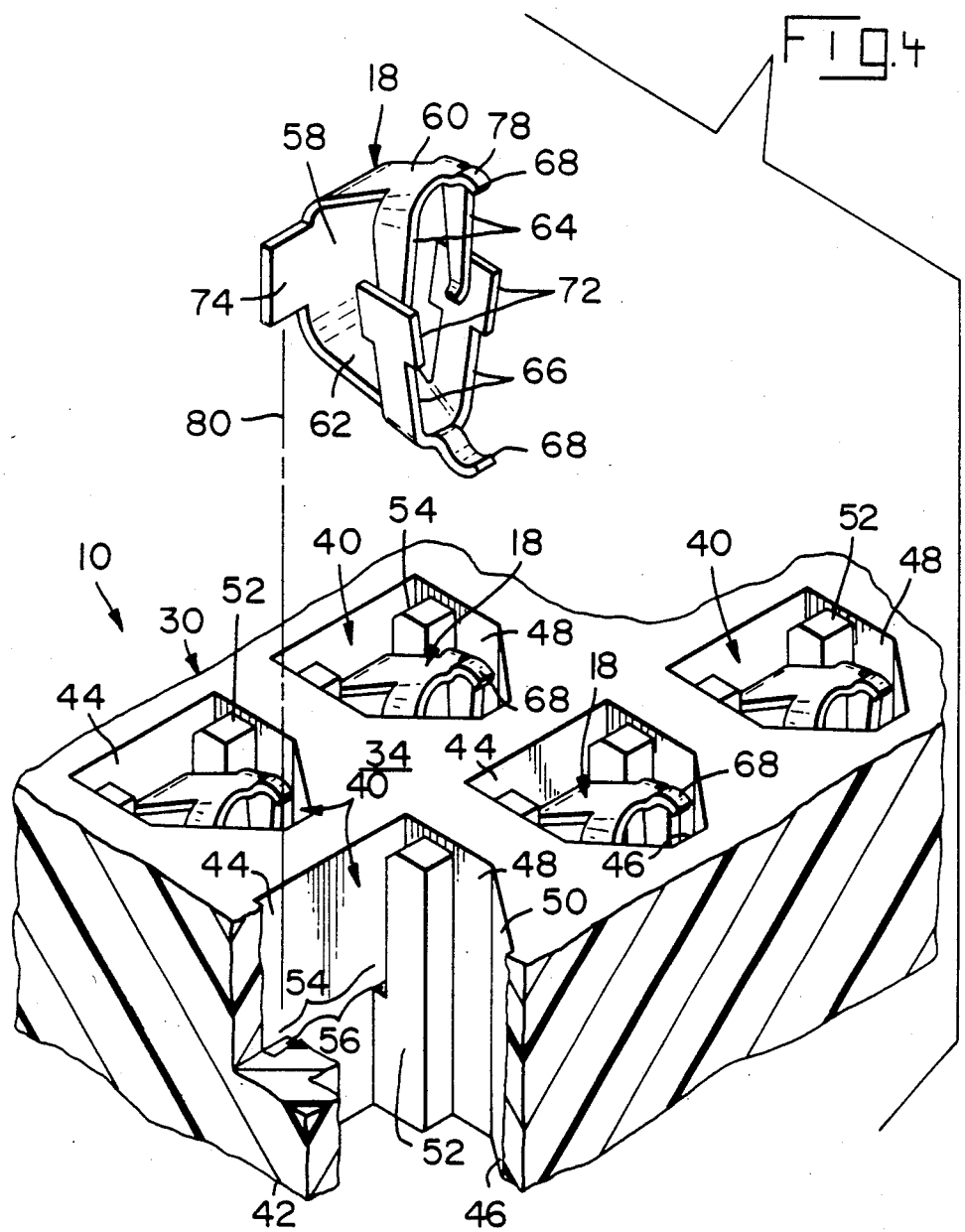

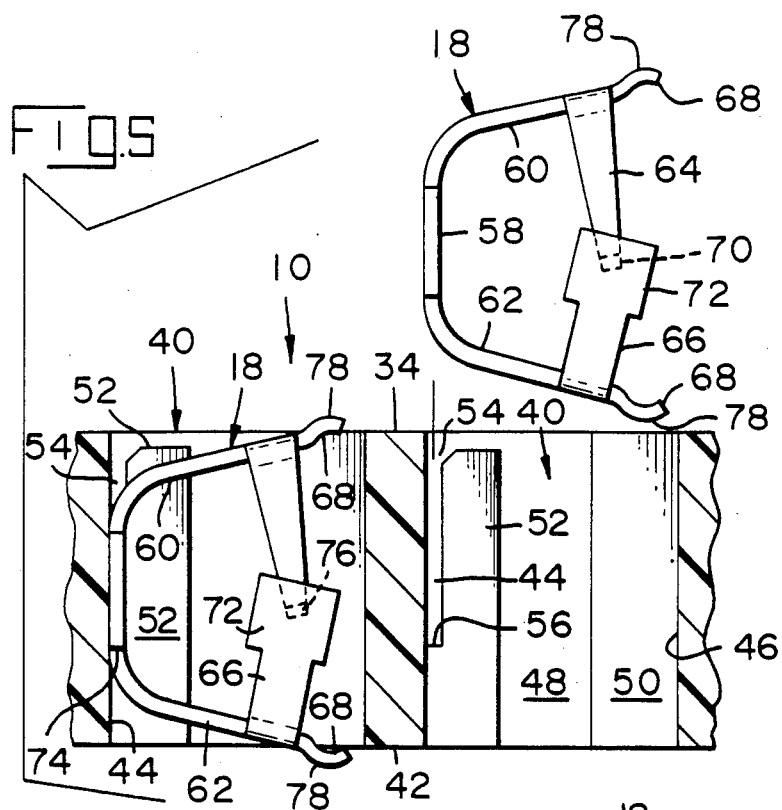
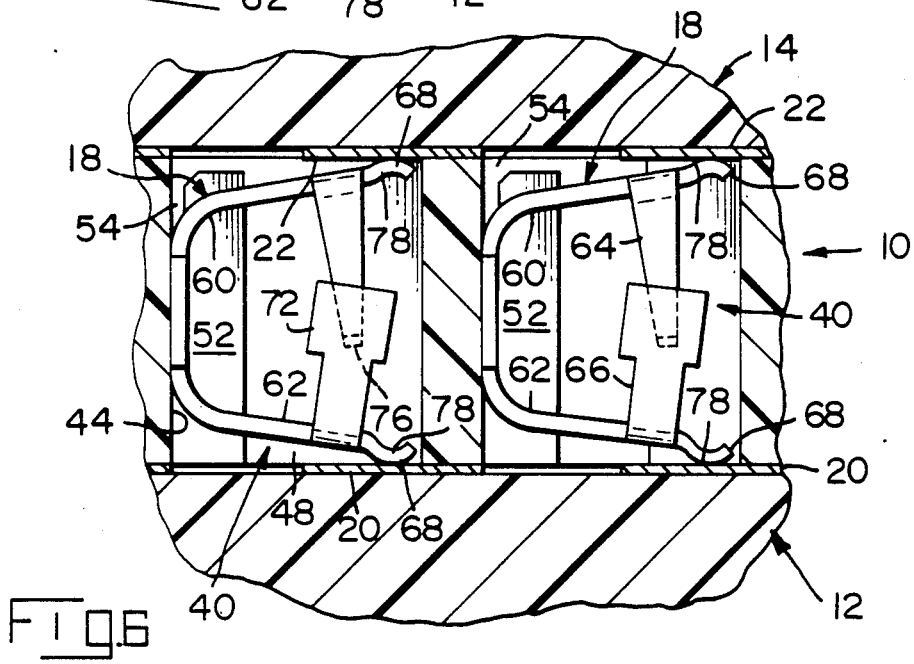

ELECTRICAL CONNECTOR FOR INTERCONNECTING ARRAYS OF CONDUCTIVE AREAS

FIELD OF THE INVENTION

The invention disclosed herein is in the field of electrical connectors providing electrical interconnections between electrical components such as circuit boards and leadless electronic packages.

BACKGROUND OF THE INVENTION

Electrical connectors such as disclosed in U.S. Pat. No. 4,502,747 include a dielectric housing having a plurality of conductive contact elements therein providing electrical interconnections between electrical components such as printed circuit boards, leadless chip carriers and pad array packages. The contact elements include an elongated cantilever beam on one end, a short tail section at the other end and a retaining section in between. The free end of the cantilever beam includes a convex shaped contact area for engaging a conductive pad on one electrical component such as a pad array package. The short, curved tail section engages a conductive pad on the second electrical component; e.g., a circuit board, and preferably is soldered thereto. The retaining section secures the contact element in the dielectric housing. While this type connector has use in low speed applications, the electrical path along the elongated cantilever beam is not suitable for high speed applications. Further, the cantilever beam must provide sufficient normal contact force against the conductive pad with which it is engaged. Accordingly, spring force parameters must be factored into the contact element which means that there must be compromises made with regard to the impedance requirements with regard to speed applications.

SUMMARY OF THE INVENTION

According to the present invention, an electrical connector is disclosed which has high speed applications and into which desired electrical parameters can be designed without compromise. The electrical connector includes a dielectric housing having compartments therein with openings thereto in each of two opposing surfaces. Contact elements disposed in the compartments include diverging cantilever spring arms extending to respective openings. Free ends on the spring arms support contact areas engageable with conductive surface means on the electrical components adjacent thereto. Overlapping fingers, having specific electrical properties, are attached to and extend from the contact areas to provide a short electrical path.

BRIEF DESCRIPTION OF THE DRAWINGS

FIG. 3-B is a perspective view showing the contact element subsequent to being formed;

FIG. 4 is a perspective, partly sectioned view showing a portion of the dielectric housing with contact elements therein and one contact element exploded out therefrom;

FIG. 5 is a sectioned, side elevational view illustrating the loading and positioning of the contact elements in the dielectric housing; and FIG. 6 is a sectioned, side elevational view of the connector positioned between and electrically interconnecting two electrical components.

DESCRIPTION OF THE INVENTION

Figure 1:
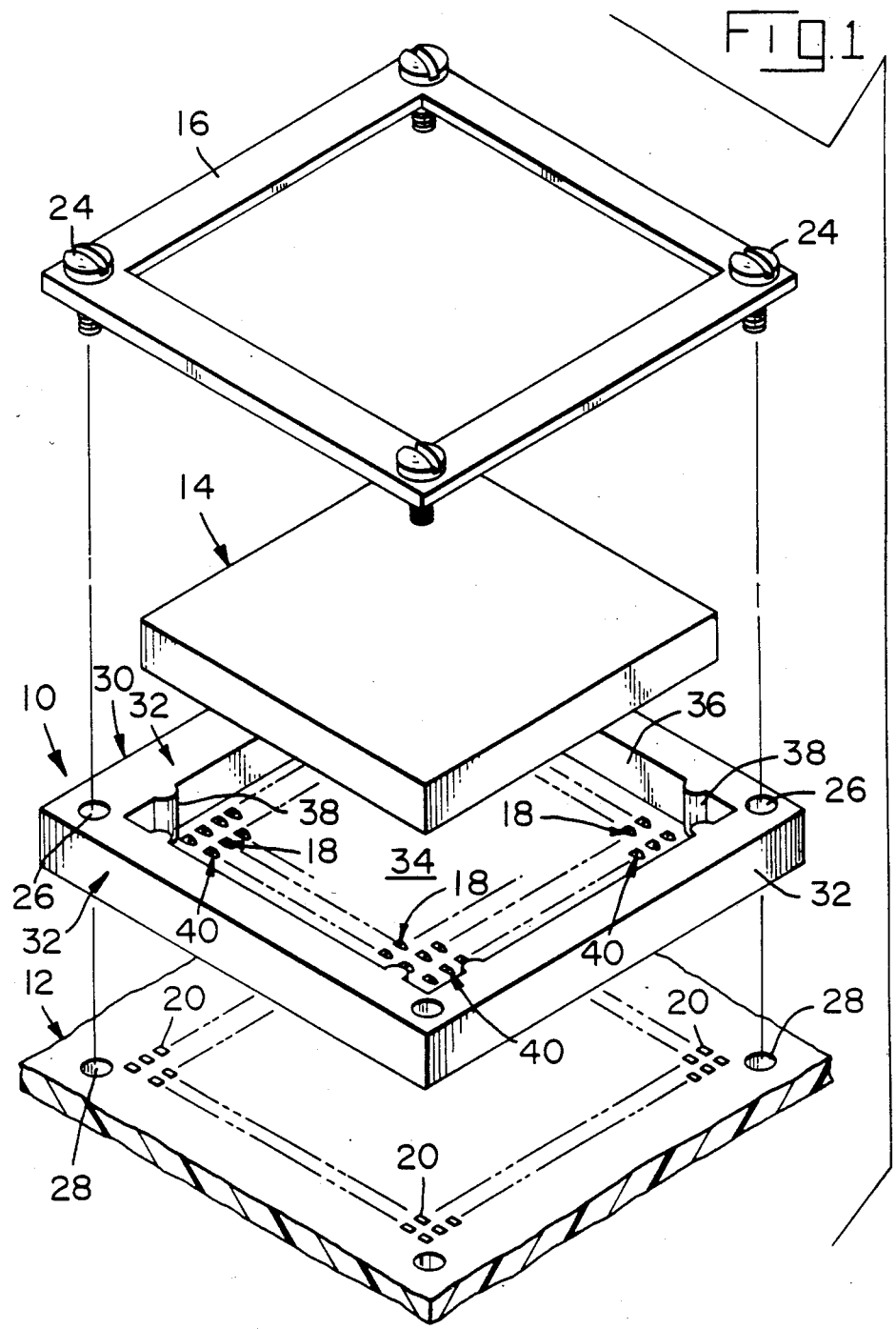
FIG. 1 is an exploded, perspective view showing generally an electrical connector of the present invention, a circuit board, an electronic pad array package and a clamping frame.

FIG. 1 shows, very generally, electrical connector 10 of the present invention and two electrical components of which one is a circuit board 12 and the other is an electronic pad array package 14. A clamping frame 16 is also shown.

Circuits (not shown) on board 12 and in package 14 are electrically interconnected through electrical connector 10 by means of contact elements 18 disposed therein which electrically engage conductive surface pads 20 on board 12 and conductive surface pads 22 (FIG. 6) on the under surface of package 14. As is well known, elements 18 and conductive pads 20, 22 are arranged in an identical pattern.

Clamping frame 16 clamps connector 10, circuit board 12 and pad array package 14 together by means such as machine screws 24 which extend through frame 16, holes 26 in connector 10 and holes 28 in board 12. Holes 28 may be threaded to receive screws 24 or alternatively the screws 24 threadably engage nuts (not shown) secured on the under surface of board 12. Other well-known fastening means could be used as well.

Although not shown, a heat sink could be mounted on pad array package 14 and held in place with little or no alterations to frame 16.

Electrical connector 10 includes dielectric housing 30 which is preferably molded from a suitable material such as a polysulfone sold by the Union Carbide Company under the trademark MINDEL.

As shown in FIG. 1, upwardly extending side walls 32 of housing 30 and surface 34 define cavity 36 in which package 14 is received. Arcuate bosses 38 on the inside surfaces of side walls 32 center package 14 in cavity 36.

Figure 2:
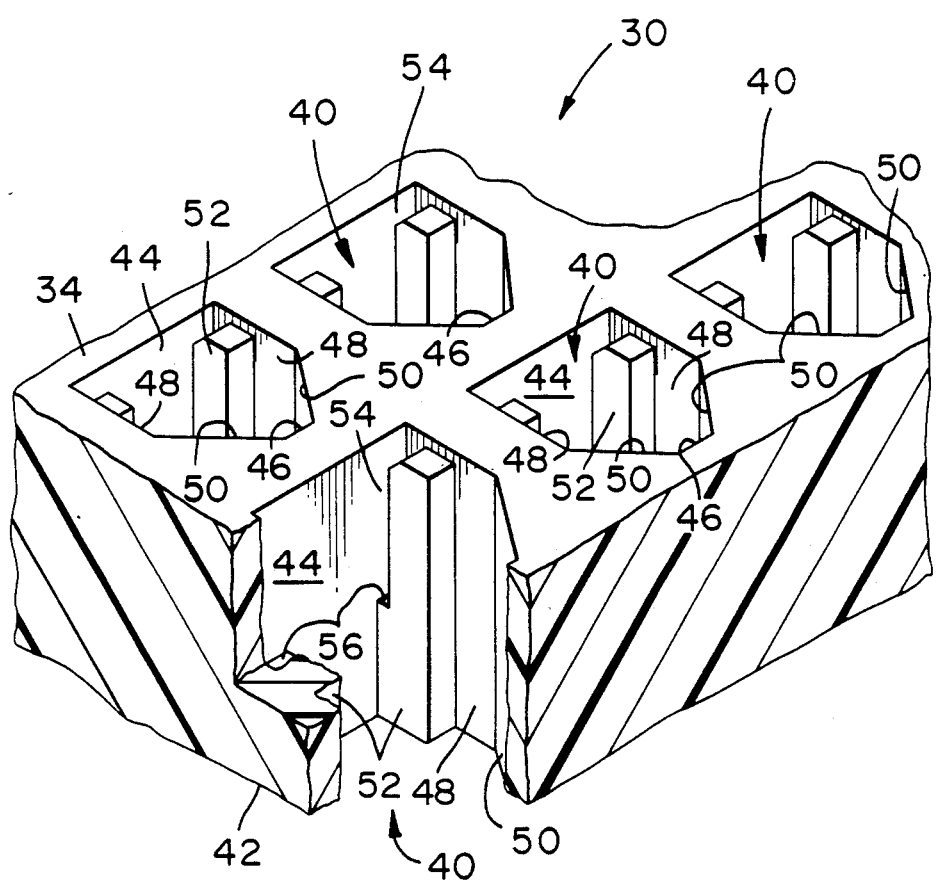
FIG. 2 is a perspective, partly sectioned view of a portion of the dielectric housing of the connector.

A plurality of compartments 40 are provided in housing 30 and containing the aforementioned contact elements 18, as shown in FIGS. 2 through 6, and are arranged in a pattern corresponding to the pattern of conductive pads 20, 22 on board 12 and pad array package 14, respectively. FIG. 2 shows several compartments 40 with one cut away to show internal details.

Each compartment 40 opens out onto surface 34 and opposing surface 42 of housing 30 and is defined by five vertical walls: opposing back and front walls 44, 46 respectively, opposing side walls 48 and forwardly converging side walls 50. L-shaped posts 52 are located adjacent the two corners defined by back wall 44 and side walls 48 and provide upwardly directed open slots 54 in cooperation with back wall 44, and also slot floors 56. Floors 56 are preferably located just below the point where sections of contact elements 18 while resting thereon would be centered in compartments 40. As will be shown later, elements 18 are automatically centered upon positioning connector 10 between board 12 and package 14. Accordingly, it is only necessary to insure, during molding, that the core pins (not shown) do not place slot floors 56 above the centering point of compartments 40.

Figure 3A:
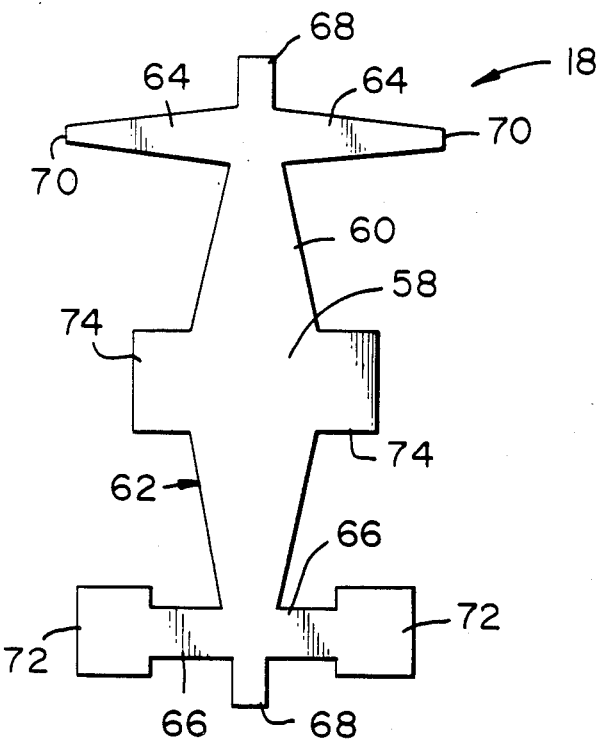
FIG. 3-A is a plan view showing a blanked-out contact element of the connector.
Figure 3B:
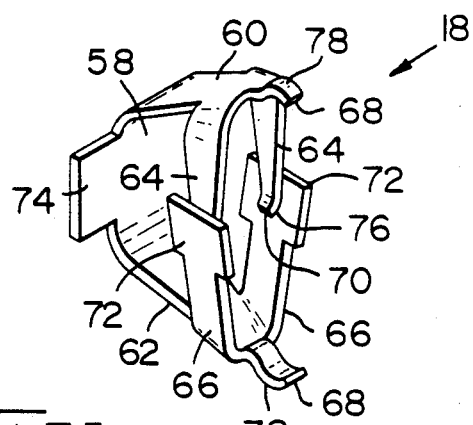

Contact elements 18 are preferably stamped and formed from flat stock having the desirable electrical and spring characteristics, a suitable material being beryllium copper. FIG. 3-A shows one element 18 blanked out but not formed. Element 18 includes a center support 58 with cantilever spring arm 60 attached to and extending out from one edge and cantilever spring arm 62 attached to and extending out from an opposing edge. Spring arms 60, 62 decrease uniformly in width from support 58 outwardly to where fingers 64, 66, attached to spring arms 60, 62 respectively, project transversely from opposing edges thereof. Arms 60, 62 diverge and continue beyond fingers 64, 66 in the form of a tab 68. Fingers 64 diverge outwardly to free ends 70. Fingers 66 terminate in square plates 72. Ears 74 extend from the ends of center support 58.

FIG. 3-B shows a formed contact element 18. The sequence in forming a stamped article is well known to those skilled in the stamping and forming art and accordingly is not detailed here.

Both fingers 64 and 66 are folded up into a U-shape on the same side of the blank of FIG. 3-A. Free ends 70 of fingers 64 have been formed into a concavo-convex shape with convex surfaces 76 facing outwardly.

Spring arms 60, 62 are folded up towards each other; i.e., on the same side of center support 58, to where fingers 64 enter in between fingers 66 and with convex surfaces 76 engaging the inside surfaces of plates 72. The degree of frictional force between convex surfaces 76 and plates 72 is predetermined and is a function of how far fingers 64, 66 need to be folded in. Tabs 68 are formed into a concavo-convex surface with the outwardly facing convex surfaces providing contact areas 78.

FIG. 4 is a view of several contact elements 18 loaded into compartments 40 of housing 30 to form electrical connector 10. One element 18 has been exploded out of a cut-away compartment 40 for illustrational purposes.

As indicated by broken line 80, elements 18 are positioned in compartments 40 and are retained therein by ears 74 being received in slots 54. Center support 58 is against back wall 44 and tabs 68, facing front wall 46, are adjacent surfaces 34, 42. Elements 18 are freely inserted into compartments 40 and are retained therein via ears 74 being disposed in slots 54 and engaging slot floors 56.

FIG. 5 is a sectioned, side elevational view of a portion of connector 10 showing one contact element 18 in a compartment 40 and another element 18 exploded from its compartment 40. This view clearly shows slots 54 defined by rear wall 44 and posts 52. It also shows that contact areas 78 extend out of compartments 40 through openings on opposing surfaces 34 and 42 and that fingers 64 are in between fingers 66 with convex surfaces 76 on the former engaging plates 72 on the latter.

FIG. 6 is a view similar to FIG. 5 but with connector 10 positioned between two electrical components; e.g., circuit board 12 and pad array package 14. Circuits (not shown) on board 12 and package 14 are electrically interconnected by contact elements 18 and more particularly by contact areas 78 engaging conductive pads 20 on board 12 and conductive pads 22 on package 14. The electrical path between pads 20, 22 is through fingers 64, 66 which is substantially shorter than through spring arms 60, 62 and center support 58. Further, as a comparison between the element 18 in compartment 40 in FIGS. 5 and 6 show, as frame 16 (FIG. 1) clamps connector 10, board 12 and package 14 together, spring arms 60, 62 are compressed in towards each other. This causes convex surfaces 76 on fingers 64 to move along plate 72, wiping the contacting surfaces therebetween and further decreasing the aforementioned electrical path through fingers 64, 66. Moreover, contact areas 78 wipingly engage respective conductive pads 20, 22 of circuit board 12 and package 14 when connector 10, board 12 and package 14 are clamped together.

As noted above, contact elements 18 are loosely positioned in compartments 40 and are freely movable therein. In bringing connector 10, circuit board 12 and pad array package 14 together, as shown in FIG. 6, elements 18 are automatically centered so the contact areas 78 on spring arms 60, 62 will wipingly engage respectively aligned conductive pads 20, 22. The automatic centering of contact elements 18 in compartments 40 is accomplished by spring arms 60, 62 and posts 52 and converging side walls 50 and plates 72. Thus, advantageously, tolerance conditions are accommodated and the electrical integrity of the interconnection is insured.

An important feature of the present invention is that the dimensions of fingers 64, 66 can be tailored to provide desired electrical properties within the capabilities of the material; e.g., beryllium copper, used without affecting the spring characteristics of cantilever spring arms 60, 62 as well as to meet the impedance requirements for high speed applications. Another important feature is that the spring between contact elements is very small for high density interconnections between closely spaced conductive areas of electronic components.

I claim:

1. An electrical connector for positioning between and interconnecting electrical components having conductive means on the surfaces thereof, comprising:

dielectric housing means having compartments therein with openings thereto through two opposing surfaces;

contact element means disposed in said compartments and having diverging cantilever spring arms extending to respective said openings for electrically engaging conductive means on said electrical components adjacent said openings; and a pair of fingers on opposing edges of each cantilever spring arm thereby forming a U-shape with the opening thereto being towards the other spring arm, said fingers on one spring arm, said fingers on one spring arm slidingly engaging respective fingers on the other spring arm to provide a shortened electrical path therebetween.

2. The electrical connector of claim 1 wherein one pair of fingers include convex surfaces threon and the other pair of fingers include plate means thereon engagable by said convex surfaces.

3. A contact element for being disposed in a compartment of a dielectric housing with openings thereto through two opposing surfaces of housing, said contact element comprising diverging cantilever spring arms extending from opposite edges of support means to respective said openings for electrical engagement with electrical components which may be adjacent said openings and having a pair of fingers on opposing edges of each cantilever spring arm with each of said pairs forming a U-shape and with the free ends of one pair being disposed within and slidingly engaging the free ends of the other pair for providing an electrical path therebetween.

4. The contact element of claim 3 wherein the free ends on one pair of fingers are convex-shaped and the free ends on the other pair of fingers are plate-shaped.

* * * * *